(12) United States Patent
Lemson

(10) Patent No.: US 9,741,543 B2
(45) Date of Patent: Aug. 22, 2017

(54) MULTI-RANGE VOLTAGE SENSOR AND METHOD FOR A VOLTAGE CONTROLLED INTERFACE OF A PLASMA PROCESSING SYSTEM

(71) Applicant: Lam Research Corporation, Fremont, CA (US)

(72) Inventor: Gary M. Lemson, Boulder Creek, CA (US)

(73) Assignee: Lam Research Corporation, Fremont, CA (US)

( * ) Notice: Subject to any disclaimer, the term of this patent is extended or adjusted under 35 U.S.C. 154(b) by 496 days.

(21) Appl. No.: 14/336,355

(22) Filed: Jul. 21, 2014

(65) Prior Publication Data

US 2016/0020075 A1 Jan. 21, 2016

(51) Int. Cl.
*G01R 27/26* (2006.01)
*H01J 37/32* (2006.01)
*G01R 15/26* (2006.01)
*G01R 15/04* (2006.01)
*G01R 19/00* (2006.01)

(52) U.S. Cl.
CPC ........ *H01J 37/32183* (2013.01); *G01R 15/04* (2013.01); *G01R 15/26* (2013.01); *G01R 19/0084* (2013.01); *H01J 37/3299* (2013.01); *H01J 37/32155* (2013.01); *H01J 37/32577* (2013.01); *H01J 37/32706* (2013.01); *H01J 37/32715* (2013.01); *H01J 37/32935* (2013.01); *H01J 2237/332* (2013.01); *H01J 2237/334* (2013.01)

(58) Field of Classification Search
USPC ................. 324/750.01, 750.03, 96; 250/282; 279/128
See application file for complete search history.

(56) References Cited

U.S. PATENT DOCUMENTS

| 5,529,657 | A | | 6/1996 | Ishii | |
|---|---|---|---|---|---|
| 5,872,456 | A | * | 2/1999 | Roderick | ............... G01R 27/26 250/282 |
| 5,955,793 | A | | 9/1999 | Khadkikar et al. | |
| 5,981,899 | A | | 11/1999 | Perrin et al. | |

(Continued)

FOREIGN PATENT DOCUMENTS

EP 1043593 B1 9/2002

OTHER PUBLICATIONS

Rogelio Palomera-Arias, "PIN Diode Switch Circuit for Short Time High Current Pulse Signal", May 22, 1998, 61 pages.

*Primary Examiner* — Vincent Q Nguyen

(57) ABSTRACT

A voltage sensor for a voltage controlled interface of a plasma processing system. The voltage sensor receives a RF signal generated by a pickup device. The RF signal is indicative of a RF voltage provided at a substrate in a plasma chamber. The voltage sensor includes first and second dividers corresponding to first and second channels and having first and second capacitance ratios. The dividers receive the RF signal and respectively generate first and second reduced voltage signals. A first output of the first channel outputs a first output signal based on the first reduced voltage signal and while the RF signal is in a first voltage range. A second output of the second channel outputs a second output signal based on the second reduced voltage signal and while the RF signal is in a second voltage range.

21 Claims, 4 Drawing Sheets

(56) References Cited

U.S. PATENT DOCUMENTS

| | | |
|---|---|---|
| 6,198,616 B1 * | 3/2001 | Dahimene ........... H01L 21/6831 |
| | | 279/128 |
| 6,281,469 B1 | 8/2001 | Perrin et al. |
| 6,407,540 B1 | 6/2002 | Shepherd |
| 6,563,076 B1 | 5/2003 | Benjamin et al. |
| 7,393,433 B2 | 7/2008 | Tanikuni et al. |
| 8,501,631 B2 | 8/2013 | Valcore, Jr. et al. |
| 8,650,002 B2 | 2/2014 | Choi et al. |
| 8,741,095 B2 | 6/2014 | Koshimizu |
| 8,909,365 B2 | 12/2014 | Valcore, Jr. |

\* cited by examiner

MULTI-RANGE VOLTAGE SENSOR AND METHOD FOR A VOLTAGE CONTROLLED INTERFACE OF A PLASMA PROCESSING SYSTEM

FIELD

The present disclosure relates to plasma processing systems and, more particularly, detecting voltages in an electrostatic chuck of a plasma processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Ionized gas, or plasma, is commonly used during the processing and fabrication of semiconductor devices. For example, plasma can be used to etch or remove material from a substrate such as a semiconductor wafer, and to sputter or deposit material onto the substrate. Creating plasma for use in manufacturing or fabrication processes typically begins by introducing process gases into a processing chamber. The substrate is disposed in the processing chamber on a substrate support such as an electrostatic chuck or a pedestal.

The processing chamber may include a transformer coupled plasma (TCP) reactor coil. A radio frequency (RF) signal, supplied by a power supply, is supplied to the TCP reactor coil. A dielectric window, constructed of a material such as ceramic, is incorporated into an upper surface of the processing chamber. The dielectric window allows the RF signal from the TCP reactor coil to be transmitted into the interior of the processing chamber. The RF signal excites gas molecules within the processing chamber to generate plasma.

The plasma includes electrons and positively charged particles. The electrons, being lighter than the positively charged particles, tend to migrate more readily, causing a sheath to form at surfaces of the processing chamber. A self-biasing effect causes a net negative charge at inner surfaces of the processing chamber. This net negative charge is provided relative to ground (referred to as a direct current (DC) bias) and relative to a potential of the plasma (referred to as DC sheath potential). The DC bias is a difference in electrical potential between a surface within the processing chamber and ground. The DC sheath potential is a difference between the potential of the surface within the processing chamber and the potential of the plasma. The DC sheath potential causes the heavier positively charged particles to be attracted towards the inner surfaces of the processing chamber. Strength of this DC sheath potential at the substrate largely determines the energy with which the positively charged particles strike the substrate. This energy affects process characteristics such as an etch rate or a deposition rate.

A bias RF power source supplies a biasing RF signal to the substrate support. The biasing RF signal can be used to increase the DC bias and/or the DC sheath potential to increase the energy with which the charged particles strike the substrate. Variations in the biasing RF signal produce corresponding variations in the DC bias and/or DC sheath potential at the substrate affecting the process characteristics.

A pickup device may be attached to the substrate support and is used to detect an RF peak voltage at the substrate support. A RF voltage sensor is connected to the pickup device and detects the RF peak voltage. The biasing RF signal may be adjusted based on the detected RF peak voltage to minimize variations in the DC bias and/or the DC sheath potential at the substrate.

SUMMARY

A voltage sensor is provided and is configured for a voltage controlled interface of a plasma processing system. The voltage sensor is configured to receive a RF signal generated by a pickup device. The received RF signal is indicative of a RF voltage provided at a substrate in a plasma chamber. The voltage sensor includes: a first divider corresponding to a first channel and having a first capacitance ratio; a second divider corresponding to a second channel and has a second capacitance ratio, a first output of the first channel and a second output of the second channel. The first divider is configured to receive the RF signal generated by the pickup device. The first divider generates a first reduced voltage signal. The second divider is configured to receive the RF signal generated by the pickup device. The second divider generates a second reduced voltage signal. The first output of the first channel is configured to output a first output signal based on the first reduced voltage signal and while the received RF signal is in a first voltage range. The second output of the second channel is configured to output a second output signal based on the second reduced voltage signal and while the received RF signal is in a second voltage range. The second voltage range is different than the first voltage range.

A method of operating a voltage sensor is also provided. The voltage sensor is configured for a voltage controlled interface of a plasma processing system. The voltage sensor is configured to receive a RF signal generated by a pickup device. The received RF signal is indicative of a RF voltage provided at a substrate in a plasma chamber. The method includes: receiving the RF signal generated by the pickup device at a first divider of a first channel, wherein the first divider has a first capacitance ratio; generating a first reduced voltage signal via the first divider; receiving the RF signal generated by the pickup device at a second divider of a second channel, wherein the second divider has a second capacitance ratio; and generating a second reduced voltage signal via the second divider. The method further includes: providing a first output signal via the first channel based on the first reduced voltage signal and while the received RF signal is in a first voltage range; and providing a second output signal via a the second channel based on the second reduced voltage signal and while the received RF signal is in a second voltage range, wherein the second voltage range is different than the first voltage range.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A traditional RF voltage sensor may provide a linear output for one voltage range (e.g., 1000-2000 volts (V)). The same RF sensor however may provide a non-linear output for other voltage ranges (e.g., voltages from 0 to 1000 volts (V)). Thus, the linear operating range of the RF voltage sensor is limited. The following examples disclose RF voltage sensor circuits having linear responses for multiple operating voltage ranges. In other words, the RF voltage sensors provide linear output response signals based on detected voltages over multiple operating voltage ranges.

Figure 1:
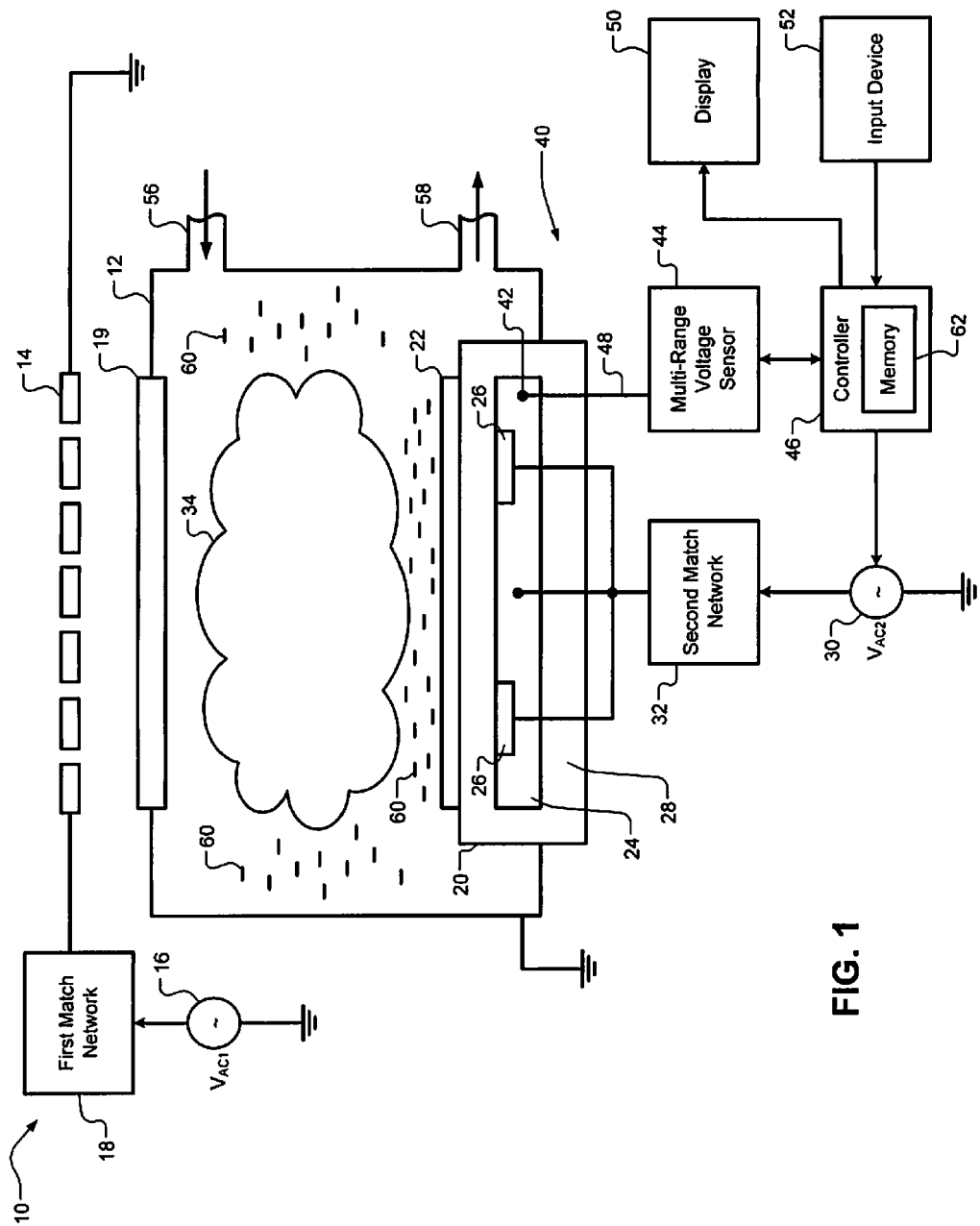
FIG. 1 is a functional block diagram of a plasma processing system incorporating a multi-range voltage sensor in accordance with the present disclosure.

FIG. 1 shows a plasma processing system 10 that includes a plasma processing chamber 12 and a transformer coupled plasma (TCP) reactor coil 14. The TCP reactor coil 14 is disposed outside and above the plasma processing chamber 12. The first power source 16 provides a first RF source signal. A first match network 18 is included between the first power source 16 and the TCP reactor coil 14. The plasma processing chamber 12 includes a ceramic window 19, which is located adjacent the TCP reactor coil 14 and allows efficient transmission of the first RF source signal into the plasma processing chamber 12 for plasma generation purposes.

The plasma processing system 10 further includes a substrate support 20 such as an electrostatic chuck, a pedestal or other suitable substrate support, located at the bottom of the plasma processing chamber 12. The substrate support 20 supports a substrate 22. If the substrate support 20 is an electrostatic chuck, the substrate support 20 includes electrically conductive portions 24 and 26, which are electrically isolated from each other. The substrate support 20 is surrounded by an insulator 28 and is capacitively coupled to the substrate 22. By applying a DC voltage across the conductive portions 24, 26, an electrostatic coupling is created between the conductive portions 24, 26 and the substrate 22. This electrostatic coupling attracts the substrate 22 against the substrate support 20.

The plasma processing system 10 further includes a bias RF power source 30, which is connected to a second match network 32. The second match network 32 is connected between the bias RF power source 30 and the substrate support 20. The second match network 32 matches an impedance (e.g., 500) of the bias RF power source 30 to an impedance of the substrate support 20 and plasma 34 in the plasma processing chamber 12 as seen by the second matching network 32.

The plasma processing system 10 further includes a voltage control interface (VCI) 40. The VCI 40 may include a pickup device 42, a multi-range voltage sensor 44 (referred to hereinafter as "the voltage sensor"), a controller 46 and any circuitry between the voltage sensor 44 and the controller 46. The pickup device 42 extends into the substrate support 20. This pickup device 42 is connected via a wire 48 to the voltage sensor 44 and is used to generate a RF voltage signal. The voltage sensor 44 is configured to detect peak voltages in the RF voltage signal for multiple voltage ranges. The voltage sensor 44 has multiple channels. The channels are allocated to corresponding ranges of input voltages received from the pickup device 42. Each of the channels provides a linear output response for a corresponding input voltage range.

The voltage sensor 44 generates output signals, which may be monitored and/or used to adjust a biasing RF signal (or second RF source signal) generated by the bias RF power source 30. Each of the channels has a linear response to changes in peak voltages of the RF voltage signal received from the pickup device 42, such that a relationship between values of the output signals and changes in the peak voltage of the RF voltage signal is linear. The output signals may include cross-check signals for determining whether an error exists with one or more of the channels.

Operation of the voltage sensor 44 may be monitored, manually controlled, and/or controlled via the controller 46. The controller 46 may display output voltages of the channels of the voltage sensor 44 on a display 50. Although shown separate from the controller 46, the display 50 may be included in the controller 46. A system operator may provide input signals indicating (i) whether to switch between the channels, (ii) which one or more of the channels to activate, and/or (ii) which one or more of the channels to deactivate. The controller 46 may receive the input signals from an input device 52 and control operation of the voltage sensor 44 based on the input signals. Although shown separate from the controller 46, the input device 52 may be included in the controller 46. As an alternative, the controller 46 may receive the output signals from the voltage sensor 44 and based on the output signals control operation of the voltage sensor 44. This may include activating and deactivating one or more of the channels. Operation of the voltage sensor 44 is further described below with respect to FIGS. 2-4.

In operation, a gas capable of ionization flows into the plasma processing chamber 12 through the gas inlet 56 and exits the plasma processing chamber 12 through the gas outlet 58. The first RF signal is generated by the RF power source 16 and is delivered to the TCP reactor coil 14. The first RF signal radiates from the TCP reactor coil 14 through the window 19 and into the plasma processing chamber 12. This causes the gas within the plasma processing chamber 12 to ionize and form the plasma 34. The plasma 34 produces a sheath 60 along walls of the plasma processing chamber 12. The plasma 34 includes electrons and positively charged ions. The electrons, being much lighter than the positively charged ions, tend to migrate more readily, generating DC bias voltages and DC sheath potentials at inner surfaces of the plasma processing chamber 12. An average DC bias voltage and a DC sheath potential at the substrate 22 affects the energy with which the positively charged ions strike the substrate 22. This energy affects processing characteristics such as rates at which etching or deposition occurs.

The controller 46 may adjust the bias RF signal generated by the RF power source 30 to change the amount of DC bias and/or a DC sheath potential at the substrate 22. The controller 46 may compare outputs of the channels of the voltage sensor 44 and/or a representative value derived based on the outputs of the channels to one or more set point values. The set point values may be predetermined and stored in a memory 62 of the controller 46. The bias RF signal may be adjusted based on differences between (i) the outputs of the voltage sensor 44 and/or the representative value and (ii) the one more set point values. The bias RF signal passes through the second match network 32. An output provided by the second match network 32 (referred to as a matched signal) is then passed to the substrate support 20. The bias RF signal is passed to the substrate 22 through the insulator 28.

Figure 2:
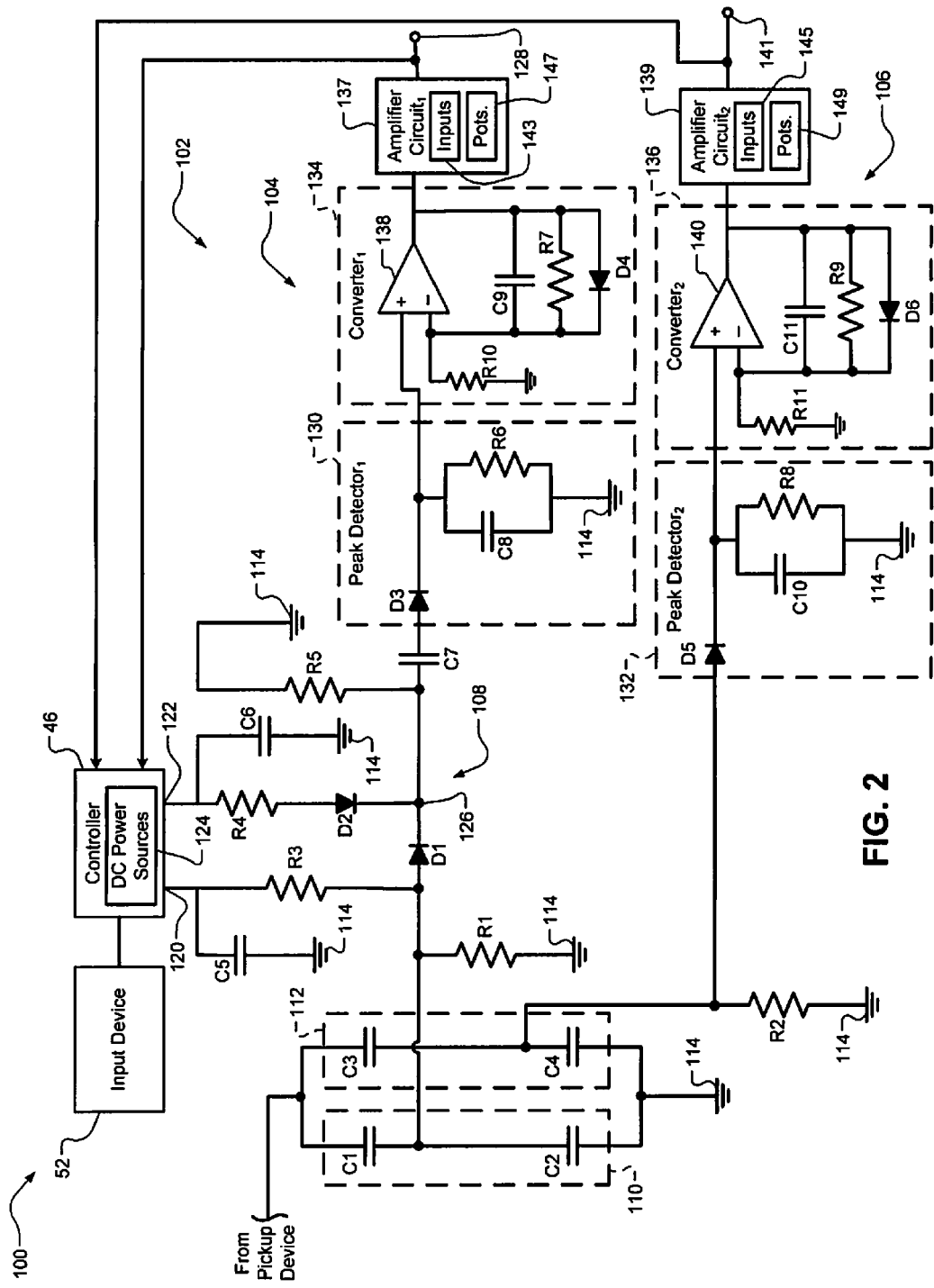
FIG. 2 is a schematic view of a voltage control interface with a multi-range voltage sensor incorporating a single cross check configuration in accordance with the present disclosure.

FIG. 2 shows a VCI 100 that includes a multi-range voltage sensor 102 (referred to hereinafter as "the voltage sensor") and the controller 46. The VCI 100 may include the input device 52. The voltage sensor 102 may be used in the plasma processing system 10 of FIG. 1 and/or replace the voltage sensor 44. The voltage sensor 102 includes multiple channels 104, 106 and a channel switching circuit 108. The channel switching circuit 108 has multiple operating states corresponding to activated and deactivated states of the channels 104, 106. In the example shown, the voltage sensor 102 includes two channels. The voltage sensor 102 may include any number of channels.

The channels 104, 106 include respective alternating current (AC) dividers 110, 112. The AC dividers 110, 112 include capacitances C1, C2, C3, C4. The first AC divider 110 includes the capacitances C1, C2 connected in series between the pickup device 42 of FIG. 1 and a ground reference 114. The second AC divider 112 includes the capacitances C3, C4 connected in series between the pickup device 42 and the ground reference 114. The first AC divider 110 is connected in parallel with the second AC divider 112.

The AC dividers 110, 112 divide a RF signal received from the pickup device 42 based on respective capacitance ratios of each of the AC dividers 110, 112. The capacitance ratio of the first AC divider 110 may be C2:C1 (e.g., 100:1). The capacitance ratio of the second AC divider 112 may be C4:C3 (e.g., 200:1). The first AC divider 110 may, for example, have a smaller capacitance ratio than the capacitance ratio of the second AC divider 112. This provides lower voltages to the first channel and higher voltages to the second channel. Outputs of the AC dividers 110, 112 are provided across respective resistances R1, R2. Resistance R1 is connected between an output of the first AC divider 110 and a ground reference 114. Resistance R2 is connected between an output of the second AC divider 112 and the ground reference 114.

The channel switching circuit 108 includes the controller 46 and diodes D1 and D2. The controller 46 (i) activates the first channel 104 by forward biasing a diode D1 and reverse biasing a diode D2, and (ii) deactivates the first channel 104 by reverse biasing the diode D1 and forward biasing the diode D2. The activation and deactivation of the first channel 104 is based on output voltages of the first channel 104 and may be based on output voltages of the second channel 106.

The controller 46, as shown has two outputs 120, 122, which provide respective DC voltages when activated. While the VCI 100 is detecting voltages via the pickup device 42 in a first range (e.g., 50-1000 peak volts (Vpk)), the first channel 104 is activated, the first output 120 provides a first DC voltage (e.g., 24V), and the second output 122 is deactivated (e.g., at 0V). The controller 46 may include a first DC power source (one of DC power sources 124) to provide the first DC voltage. As an alternative the controller 46 or a portion thereof may not be included. The first DC power source may be connected to and supply the first DC voltage to the resistance R3 and the capacitance C5. The supplying of the first DC voltage provides a positive DC voltage to an anode of the diode D1, which activates the diode D1 and allows a first voltage across resistance R1 (or RF signal received from the first AC divider 110) to be passed through the diode D1. Voltage at a cathode of the diode D2 is higher than a voltage at an anode of the diode D2. As a result, the diode D2 is deactivated.

While the VCI 100 is detecting voltages via the pickup device 42 in a second range (e.g., 100-2000Vpk), the first channel 104 is deactivated, the first output 120 is deactivated (e.g., transitioned to 0V), and the second output 122 provides a second DC voltage (e.g., 24V). The controller 46 may include a second DC power source (one of DC power sources 124) to provide the second DC voltage. As an alternative, the controller 46 or a portion thereof may not be included. The second DC power source may be connected to and supply the second DC voltage to the resistance R4 and the capacitance C6. The second DC power source may be a same or different power source than the first DC power source. The supplying of the second DC voltage provides a positive voltage to the anode of the diode D2 and a positive voltage to a cathode of the diode D1. This deactivates the diode D1 and activates the diode D2. While the diode D1 is deactivated and the diode D2 is activated, the voltage across resistance R1 (or RF signal received from the first AC divider 110) is not permitted to pass through the diode D1 and a voltage at a node 126 between the diodes D1, D2 is low or negligible. This provides a low-voltage at an output 128 of the first channel 104, which can be used to indicate that the first channel 104 is properly deactivated.

The first channel 104 further includes voltage dividers. The voltage dividers are provided by resistances R3, R4, R5. While the channel switching circuit 108 is in a first state (e.g., the first channel is activated), the first voltage divider is provided by the resistances R3 and R5. While the channel switching circuit 108 is in a second state (e.g., the first channel is deactivated), the second voltage divider is provided by the resistances R4 and R5 The voltage dividers limit current and/or voltage at the node 126 and provided to a first peak detector 130. While the first channel 104 is deactivated (i.e. the diode D1 is reversed biased and the diode D2 is forward biased), the second output 122 of the controller 46 and the second voltage divider effectively operate as a shunt. This minimizes voltage at the node 126 and voltage at the output 128 of the first channel 104.

The resistance R3 is connected between (i) the first output 120 of the controller 46 and (ii) the output of the first AC divider 110 and the diode D1. The capacitance C5 (referred to as a bypass capacitance) is connected between (i) the first output 120 of the controller 46 and the resistance R3 and (ii) the ground reference 114. The resistance R4 is connected between (i) the second output 122 of the controller 46 and (ii) the anode of diode D2. The capacitance C6 (referred to as a bypass capacitance) is connected between (i) the second output 122 of the controller 46 and the resistance R4 and (ii) the ground reference 114. The bypass capacitances C5, C6 are provided for signal conditioning to, for example, remove noise from the RF signals provided by the AC divider 110.

One or more of the resistances R3 and R4 may be replaced with inductors. In another implementation, inductors are included in addition to the resistances R3 and R4. The inductors may be connected in series with the resistances R3 and R4. As an example, a first inductor may be connected in series with the resistance R3 between (i) the first output 120 of the controller 46 and (ii) the anode of the diode D1. A second inductor may be connected in series with the resistance R4 between (i) the second output 122 of the controller 46 and (ii) the anode of the diode D2. If inductors are used in replacement of or in addition to the resistances R3 and/or R4, the resistance R5 may be increased, as compared to when the inductors are not incorporated in the VCI 100. The inductors may be used to choke off RF current received from the AC divider 110.

The channels 104, 106 further include respective peak detectors 130, 132, converters 134, 136, and amplifier circuits 137, 139. The peak detectors 130, 132 include respective diodes D3, D5, capacitances C8, C10 and resistances R6, R8. The diode D3 receives outputs of the diode D1. A capacitance C7 is connected between (i) the diodes D1, D2 and (ii) the diode D3. This AC couples an input of the first peak detector 130 and thus prevents DC from being received by the diode D3. The capacitance C7 blocks the DC voltages provided by the controller 46 and/or portions thereof from being received at the first peak detector 130 and diode D3. The capacitance C8 and the resistance R6 are connected in parallel between a cathode of the diode D3 and the ground reference 114. The capacitance C10 and the resistance R8 are connected in parallel between a cathode of the diode D5 and the ground reference 114. Outputs of the peak detectors 130, 132 are provided to the converters 134, 136.

The converters 134, 136 may amplify and/or convert outputs of the peak detectors 130, 132 to DC voltages. The DC voltages may be provided respectively to amplifier circuits 137, 139. The amplifier circuits 137, 139 may have respective inputs 143, 145. The amplifier circuits 137, 139 adjust linearity of the DC voltage signals out of the converters 134, 136. For example, the amplifier circuits 137, 139 may adjust slope and/or intercept (referred to as offset) of the DC voltage signals out of the converters 134, 136. The amplifier circuits 137, 139 may include potentiometers 147, 149, which may be used to adjust the slope and the offset of the DC voltage signals out of the converters 134, 136. A first potentiometer of each of the amplifier circuits 137, 139 may be used to adjust an input, gain, and/or attenuation of the amplifier circuits 137, 139 and/or of amplifiers included in the amplifier circuits 137, 139. A second potentiometer of each of the amplifier circuits 137, 139 may be used to adjust an output and/or offset of the amplifier circuits 137, 139 and/or of amplifiers included in the amplifier circuits 137, 139. The inputs 143, 145 may be manually entered inputs or may be inputs from the controller 46. The inputs 143 may be used to adjust respectively the potentiometers 147. The inputs 145 may be used to adjust respectively the potentiometers 149. Incorporation and adjustment of the potentiometers 147, 149 accounts for non-linear behavior of the diodes D3, D5. The amplifier circuits 137, 139 may be separate from the controller 46 as shown or may be included in the controller 46.

The amplifier circuits 137, 139 generate linearity adjusted signals based on the DC output signals. The DC output signals and/or linearity adjusted signals out of the amplifier circuits 137, 139 may be fed back to the controller 46, which may adjust operation of the bias RF power source 30 of FIG. 1 based on the DC voltages, DC output signals, and/or the linearity adjusted signals. The controller 46 may also activate or deactivate the first channel based on the DC voltages, DC output signals, and/or the linearity adjusted signals fed back to the controller 46.

The converters 134, 136 include respective operational amplifiers 138, 140, capacitances C9, C11, resistances R7, R9, diodes D4, D6, and resistances R10, R11. A non-inverting input of the first operational amplifier 138 receives the output of the first peak detector 130. The capacitance C9, resistance R7 and diode D4 are connected in parallel across the first operational amplifier 138 between an inverting input of the first operational amplifier 138 and an output of the first operational amplifier 138. A non-inverting input of the second operational amplifier 140 receives the output of the second peak detector 132. The capacitance C11, resistance R9 and diode D6 are connected in parallel across the second operational amplifier 140 between an inverting input of the second operational amplifier 140 and an output of the second operational amplifier 140. Anodes of the diodes D4, D6 are connected to the outputs of the operational amplifiers 138, 140. Cathodes of the diodes D4, D6 are connected to the inverting inputs of the operational amplifiers 138, 140. The outputs of the operational amplifiers 138, 140 provide the DC voltages to amplifier circuits 137, 139.

The resistance R10 is connected between the inverting input of the first operational amplifier 138 and the ground reference 114. The resistance R11 is connected between the inverting input of the second operational amplifier 140 and the ground reference 114. The resistances R10, R11 are used to set up gain of the operational amplifiers 138, 140. While the diodes D4, D6 are not fully conducting, gain is provided due to incorporation of the resistances R10, R11. This aids in amplification of low-amplitude signals while the diodes D4, D6 are not conducting and/or are not fully conducting. While the diodes D4, D6 are fully conducting, gain of the converters 134, 136 may be unity gain.

The first channel 104 may be used for input (or detected) voltages in the first range (e.g., 50-1000Vpk) and provide corresponding DC output voltages (or the linearity adjusted signals) in a third range (e.g., 0.5-10V) at the first output 128. The second channel 106 may be used for input (or detected) voltages in a second range (e.g., 100-2000Vpk) and provide corresponding DC output voltages (or the linearity adjusted signals) in a fourth range (e.g., 0.5-10V) at a second output 141. The controller 46 may switch operating states of the diodes D1, D2 based on the DC output voltages (or the linearity adjusted signals) of the channels 104, 106.

While the VCI 100 is detecting voltages in the second range, high voltages exist at the output of the AC dividers 110, 112. While the VCI 100 is detecting voltages in the second range and the first channel is deactivated, the low-voltage is provided at the node 126 between the diodes D1, D2. The low-voltage is within an operating range of the first peak detector 130 and first converter 134. The first peak detector 130 and the first converter 134 are configured to operate during the detection of voltages in the first range. The second peak detector 132 and the second converter 136 are configured to operate during the detection of voltages in the second range. By providing a low-voltage at the node 126 between the diodes D1, D2, the first peak detector 130 and the first converter 134 are protected from receiving high voltages experienced at the output of the first AC divider 110.

Although the VCI 100 is shown such that the second channel 106 is maintained in an activated state while the first channel 104 is activated, the VCI 100 may be modified to deactivate the second channel 106 while the first channel 104 is activated. While the first channel 104 is activated, the second channel 106 may remain activated to provide a cross-check on the first channel 104. The controller 46 may monitor and compare DC output voltages (or the linearity adjusted signals) of both of the channels 104, 106.

As an example, a difference between the DC output voltages (or the linearity adjusted signals) and/or a difference between values derived based on the DC output voltages (or the linearity adjusted signals) may (i) confirm that both channels 104, 106 are operating appropriately (i.e. no detected errors), or (ii) indicate one or more of the channels 104, 106 is operating inappropriately and/or one or more errors exist. An error may refer to a problem associated with the pickup, the chuck, the chamber, one of the channels, one or more components of one of the channels, etc. As another example, if the difference between the DC output voltages (or the linearity adjusted signals) of the channels 104, 106 (and/or a difference between values derived based on the DC output voltages or a difference between values derived based on the linearity adjusted signals) is less than or equal to a predetermined value and/or within a first predetermined range, both of the channels 104, 106 may be operating appropriately. If the difference between the DC output voltages (or the linearity adjusted signals) of the channels (and/or a difference between values derived based on the DC output voltages or a difference between values derived based on the linearity adjusted signals) is greater than the predetermined value and/or within a second predetermined range, both of the channels 104, 106 may be operating inappropriately.

Figure 3:
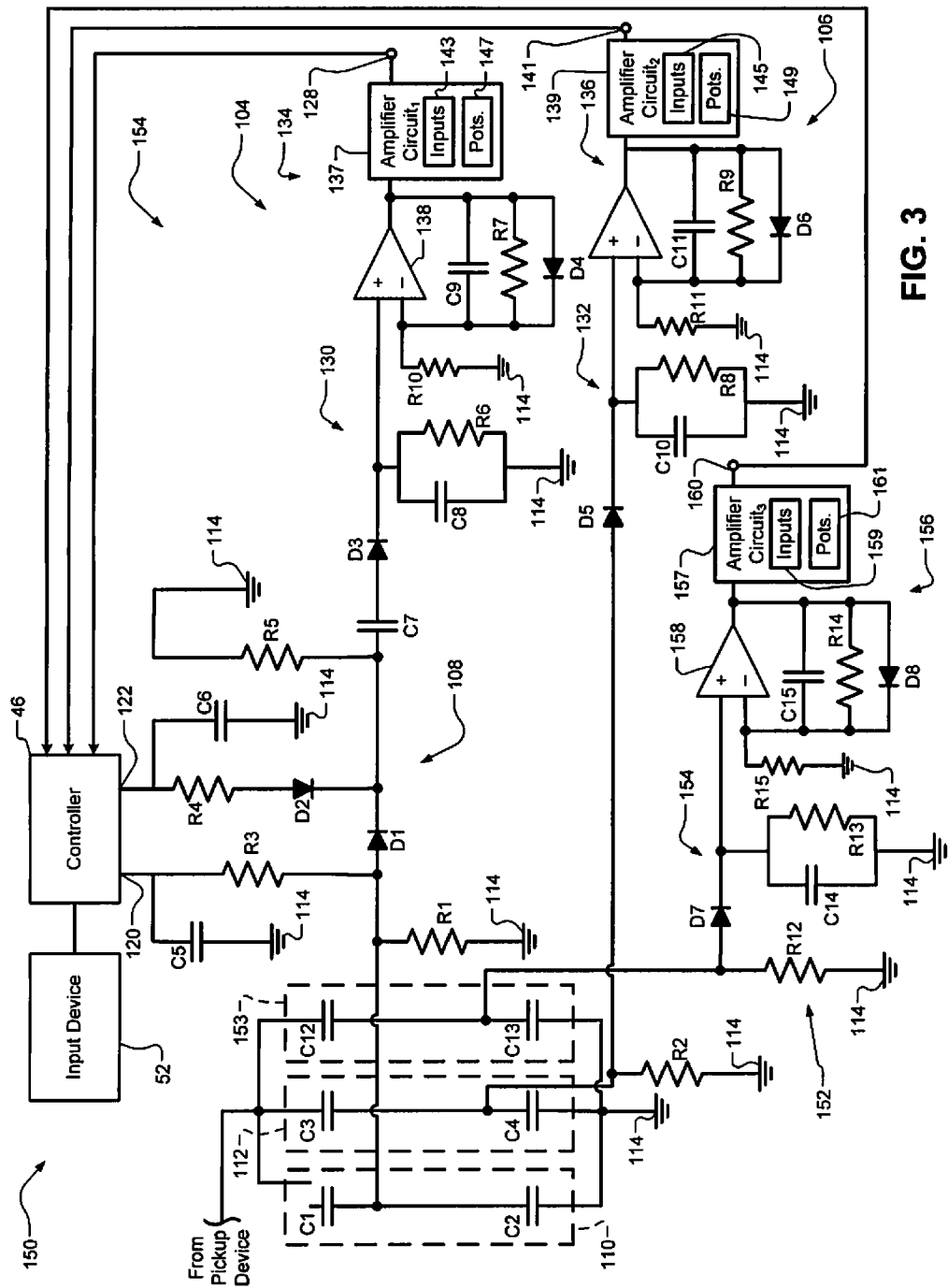
FIG. 3 is a schematic view of a voltage control interface with another multi-range voltage sensor incorporating a multi-cross check configuration in accordance with the present disclosure.

The VCI 100 does not include a cross-check for the second channel 106 when the first channel is deactivated. FIG. 3 shows a VCI 150 that provides a third channel 152, which may be used to cross-check the second channel 106. The VCI 150 is similar to the VCI 100 of FIG. 2 in that the VCI 150 also includes a multi-range voltage sensor 154 and the controller 46. The VCI 150 may include the input device 52. The VCI 150 includes the AC dividers 110, 112 the channel switching circuit 108, the peak detectors 130, 132, the converters 134, 136, and the amplifier circuits 137, 139. The AC dividers 110, 112 include the capacitances C1-C4. The channel switching circuit 108 includes the controller 46, the diodes D1 and D2, the resistances R3, R4, R5, and the capacitances C5, C6. The peak detectors 130, 132 include the diodes D3, D5, capacitances C8, C10, and resistances R6, R8. The converters 134, 136 include the operational amplifiers 138, 140, the capacitances C9, C11, the resistances R7, R9, the diodes D4, D6, and the resistances R10, R11.

The third channel 152 may include a third AC divider 153, a third peak detector 154, a third converter 156, and a third amplifier circuit 157. The third AC divider 153 includes capacitances C12, C13 connected in parallel with the AC dividers 110, 112. The third peak detector 154 includes diode D7, capacitance C14 and resistance R13. An anode of the diode D7 is connected to the output of the third AC divider 153 and to a resistance R12. The resistance R12 is connected between the third AC divider 153 and the ground reference 114. The capacitance C14 and the resistance R13 are connected in parallel between a cathode of the diode D7 and the ground reference 114.

The third converter 156 includes a third operational amplifier 158, capacitance C15, diode D8, and resistance R15. A non-inverting input of the third operational amplifier 158 is connected to the cathode of the diode D7 and to the capacitance C14 and the resistance R13. The capacitance C15, the resistance R14 and the diode D8 are connected in parallel between an inverting input and an output of the third operational amplifier 158. An anode of the diode D8 is connected to the output of the third operational amplifier 158. A cathode of the diode D8 is connected to the inverting input of the third operational amplifier 158. The operational amplifier 158 provides a DC output signal to the third amplifier circuit 157.

The resistance R15 is connected between the inverting input of the operational amplifier 158 and the ground reference 114. The resistance R15 is used to set up a gain of the operational amplifiers 158. While the diode D8 is not fully conducting, gain is provided due to incorporation of the resistance R15. This aids in amplification of low-amplitude signals while the diode D8 is not conducting and/or is not fully conducting. While the diode D8 is fully conducting, gain of the converter 156 may be unity gain.

The third amplifier circuit 157 adjusts linearity of the DC output signal received from the operational amplifier 158. The third amplifier circuit 157 may include inputs 159 and potentiometers 161. For example, the amplifier circuit 157 may adjust slope and/or intercept (referred to as offset) of the DC voltage signal out of the converter 156. The potentiometers 161 may be used to adjust respectively the slope and the offset of the DC voltage signal out of the converters 156. A first potentiometer may be used to adjust an input, gain, and/or attenuation of the amplifier circuit 157 and/or of an amplifier included in the amplifier circuit 157. A second potentiometer may be used to adjust an output and/or offset of the amplifier circuit 157 and/or of an amplifier included in the amplifier circuit 157. The inputs 159 may be manually entered inputs or may be inputs from the controller 46. The inputs 159 may be used to adjust respectively the potentiometers 161. Incorporation and adjustment of the potentiometers 161 accounts for non-linear behavior of the diode D7. The amplifier circuit 157 may be separate from the controller 46 as shown or may be included in the controller 46.

The amplifier circuits 137, 139, 157 generate linearity adjusted signals based on the DC output signals. The DC output signals and/or linearity adjusted signals out of the amplifier circuits 137, 139, 157 may be fed back to the controller 46, which may adjust operation of the bias RF power source 30 of FIG. 1 based on the DC voltages, DC output signals, and/or the linearity adjusted signals. The controller 46 may also activate or deactivate the first channel based on the DC voltages, DC output signals, and/or the linearity adjusted signals fed back to the controller 46.

The controller 46 may monitor DC output voltages (or the linearity adjusted signals) of the amplifier circuits 137, 139, 157. The DC output signal (or the linearity adjusted signal) of the third channel 152 may be used to cross-check the second channel 106 and/or the first channel 104. The third channel 152 may be used to cross-check the first channel 104 while the first channel 104 is activated and may be used to cross-check the second channel 106 while the first channel 104 is deactivated. Similarly, the DC output voltage (or the linearity adjusted signal) of the second channel 106 may be used to cross-check the DC output voltage (or the linearity adjusted signal) of the third channel 152. The described cross-checking of channels 104, 106, 152 may include comparing DC output voltages (or the linearity adjusted signals) of the channels 104, 106, 152 and/or values derived based on the DC output voltages (or the linearity adjusted signals) of the channels 104, 106, 152. Differences between the DC output voltages (or the linearity adjusted signals) of the channels 104, 106, 152 and/or values derived based on the DC output voltages (or the linearity adjusted signals) of the channels 104, 106, 152 indicate whether the channels 104, 106, 152 are operating appropriately or whether one or more errors exist.

Figure 4:
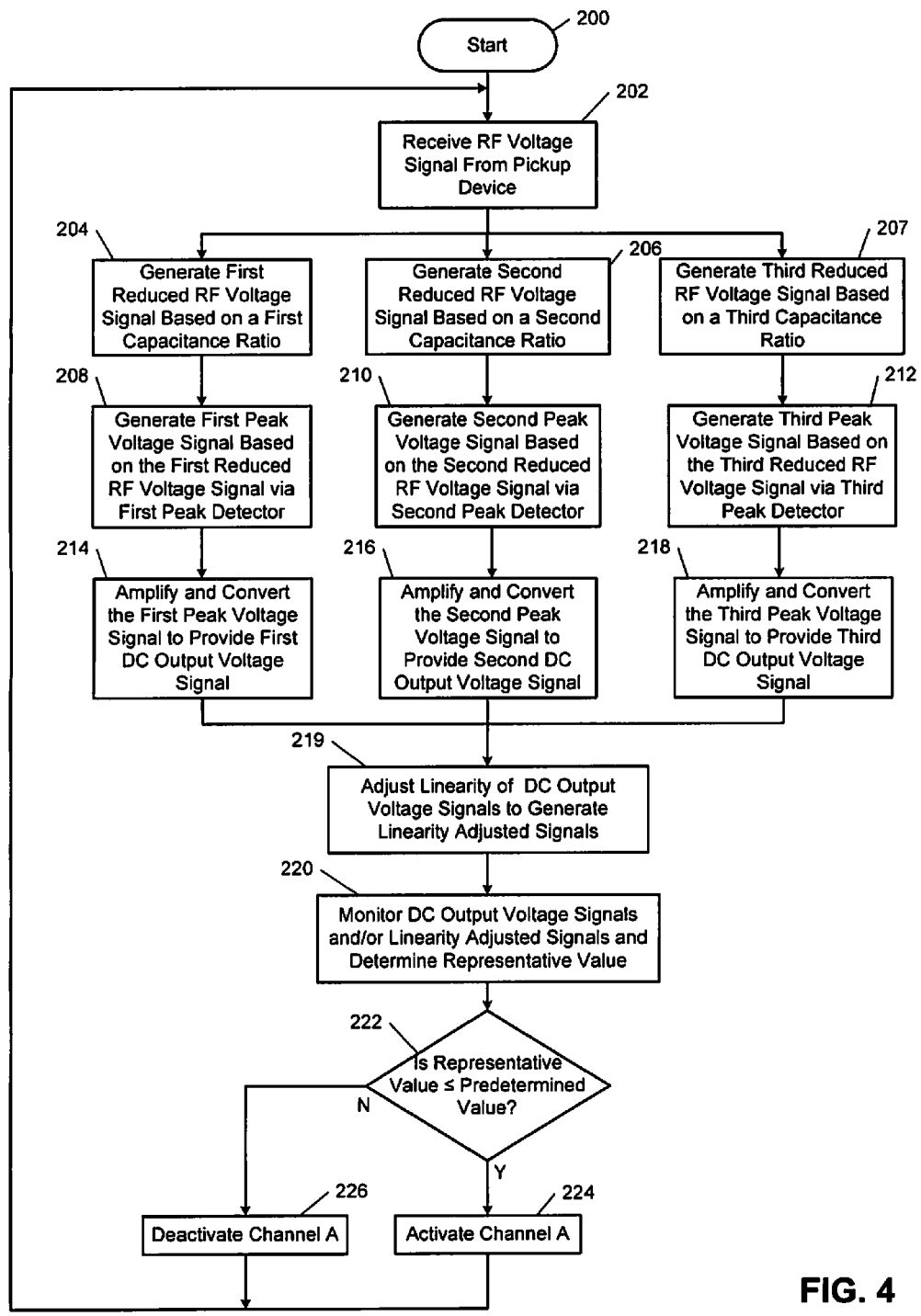
FIG. 4 illustrates a method of operating voltage controlled interface and a multi-range voltage sensor in accordance with the present disclosure.

The systems disclosed herein may be operated using numerous methods, an example method is illustrated in FIG. 4. In FIG. 4, a method of operating a VCI and a multi-range voltage sensor is shown. Although the following tasks are primarily described with respect to the implementations of FIGS. 1-3, the tasks may be easily modified to apply to other implementations of the present disclosure. The tasks may be iteratively performed.

The method may begin at 200. At 202, the AC dividers 110, 112, 153 receive a RF voltage signal from the pickup device 42 on the substrate support 20. At 204, the first AC divider 110 generates a first reduced RF signal based on the received RF voltage signal and the first capacitance ratio of the first AC divider 110. At 206, the second AC divider 112 generates a second reduced RF signal based on the received RF voltage signal and the second capacitance ratio of the second AC divider 112. Task 206 may be performed while task 204 is performed. At 207, the third AC divider 153 generates a third reduced RF signal based on the received RF voltage signal and the third capacitance ratio of the third AC divider 153. Task 207 may be performed while task 204 and/or 206 are performed.

At 208, the first peak detector 130 generates a first peak voltage signal based on the first reduced RF voltage signal. At 210, the second peak detector 132 generates a second peak voltage signal based on the second reduced RF voltage signal. At 212, the third peak detector 154 generates a third peak voltage signal based on the third reduced RF voltage signal. Tasks 210 and 212 may be performed while task 208 is performed. Task 212 may be performed while task 210 is performed.

At 214, the first converter 134 amplifies and converts the first peak voltage signal to a first DC output signal. At 216, the second converter 136 amplifies and converts the second peak voltage signal to a second DC output signal. At 218, the third converter 156 amplifies and converts the third peak voltage signal to a third DC output signal. Tasks 216 and 218 may be performed while task 214 is performed. Task 218 may be performed while task 216 is performed.

At 219, the amplifier circuits 137, 139, 157 may adjust linearity of the DC output voltage signals including adjusting gain, attenuation, and/or offset, as described above. At 220, the controller 46 may receive, display, and/or monitor the DC output voltage signals and/or the linearity adjusted signals from the amplifier circuits 137, 139, 157. The controller 46 may determine a representative value based on one or more of the DC output voltage signals and/or the linearity adjusted signals. As a first example, the representative value may be a DC output voltage of one of the DC output voltage signals and/or a DC voltage of one of the linearity adjusted signals. The representative value may indicate a peak voltage of the RF voltage signal received at 202 and may be based on one or more of the DC output voltage signals and/or one or more of the linearity adjusted signals. The representative value may be an average DC output voltage determined based on (i) voltages of one or more of the DC output voltage signals, (ii) voltages of one or more of the linearity adjusted signals, and/or (iii) averages of values derived from one or more of the DC output voltage signals and the linearity adjusted signals. The controller 46 may estimate the peak voltage of the RF voltage signal received at 202 based on one or more of the DC output voltage signals and/or the linearity adjusted signals. The representative value may be set equal to the estimated peak voltage.

If the first channel 104 is activated, the first channel 104 may be referred to as a primary channel and the second and/or third channels 106, 152 may be referred to as secondary channels. If the first channel 104 is deactivated, the second channel 106 may be referred to as a primary channel and the third channel 152 may be referred to as a secondary channel. The representative value may be solely or primarily based on the first DC output voltage signal (or the first linearity adjusted signal) while the first channel 104 is activated. The representative value may be solely or primarily based on the second DC output voltage signal (or the second linearity adjusted signal) while the first channel 104 is deactivated. When determining the representative value, the DC output voltage signal (or the linearity adjusted signal) of the primary channel may be weighted more heavily than the one or more DC output voltage signals (or the linearity adjusted signals) of the one or more secondary channels.

At 222, a system operator and/or the controller 46 may compare the representative value to a predetermined value. The predetermined value may be a predetermined voltage. For example, if the representative value is in a range of one of the DC output voltage signals or is in a range of one or more of the linearity adjusted signals, the predetermined value may be 10 (corresponding to 10V). As another example, if the representative value is in a range of the RF voltage signal received by the pickup device, the predetermined value may be 1000 (corresponding to 1000V). If the representative value is less than or equal to the predetermined value task 224 is performed, otherwise task 226 is performed.

At 224, the first channel 104, if not already activated, is activated. This may include the system operator manually or the controller 46 (i) increasing voltage of and/or applying a DC voltage to the anode of the diode D1, and (ii) decreasing voltage of and/or shutting off a DC voltage applied to the second anode of the diode D2, as described above. At 226, the first channel 104, if not already deactivated, is deactivated. This may include (i) the system operator manually or the controller 46 reducing voltage of and/or shutting off a DC voltage applied to the anode of the diode D1, and (ii) increasing and/or applying a DC voltage to the anode of the diode D2, as described above. Task 202 may be performed subsequent tasks 224 and 226.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The above-described implementations include voltage sensors, each of which having linear response for multiple operating voltage ranges. This allows the corresponding VCIs to provide accurate control of high-frequency bias voltages over a broad overall dynamic voltage range.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term controller may be replaced with the term circuit. The term controller may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The controller may include one or more interface circuits. In some examples, the interface circuits may include wired or wireless interfaces that are connected to a local area network (LAN), the Internet, a wide area network (WAN), or combinations thereof. The functionality of any given controller of the present disclosure may be distributed among multiple controllers that are connected via interface circuits. For example, multiple controllers may allow load balancing. In a further example, a server (also known as remote, or cloud) controller may accomplish some functionality on behalf of a client controller.

The term code, as used above, may include software, firmware, and/or microcode, and may refer to programs, routines, functions, classes, data structures, and/or objects. The term shared processor circuit encompasses a single processor circuit that executes some or all code from multiple controllers. The term group processor circuit encompasses a processor circuit that, in combination with additional processor circuits, executes some or all code from one or more controllers. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple controllers. The term group memory circuit encompasses a memory circuit that, in combination with additional memories, stores some or all code from one or more controllers.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory circuits (such as a flash memory circuit or a mask read-only memory circuit), volatile memory circuits (such as a static random access memory circuit and a dynamic random access memory circuit), and secondary storage, such as magnetic storage (such as magnetic tape or hard disk drive) and optical storage.

The apparatuses and methods described in this application may be partially or fully implemented by a special purpose computer created by configuring a general purpose computer to execute one or more particular functions embodied in computer programs. The computer programs include processor-executable instructions that are stored on at least one non-transitory, tangible computer-readable medium. The computer programs may also include or rely on stored data. The computer programs may include a basic input/output system (BIOS) that interacts with hardware of the special purpose computer, device drivers that interact with particular devices of the special purpose computer, one or more operating systems, user applications, background services and applications, etc. The computer programs may include: (i) assembly code; (ii) object code generated from source code by a compiler; (iii) source code for execution by an interpreter; (iv) source code for compilation and execution by a just-in-time compiler, (v) descriptive text for parsing, such as HTML (hypertext markup language) or XML (extensible markup language), etc. As examples only, source code may be written in C, C++, C#, Objective-C, Haskell, Go, SQL, Lisp, Java®, ASP, Perl, Javascript®, HTML5, Ada, ASP (active server pages), Perl, Scala, Erlang, Ruby, Flash®, Visual Basic®, Lua, or Python®.

None of the elements recited in the claims is intended to be a means-plus-function element within the meaning of 35 U.S.C. §112(f) unless an element is expressly recited using the phrase "means for", or in the case of a method claim using the phrases "operation for" or "step for".

What is claimed is:

1. A voltage sensor configured for a voltage controlled interface of a plasma processing system, wherein the voltage sensor is configured to receive a radio frequency (RF) signal generated by a pickup device, and wherein the received RF signal is indicative of a RF voltage provided at a substrate in a plasma chamber, the voltage sensor comprising:
   a first divider corresponding to a first channel and having a first capacitance ratio, wherein the first divider is configured to receive the RF signal generated by the pickup device, wherein the first divider generates a first reduced voltage signal;
   a second divider corresponding to a second channel and having a second capacitance ratio, wherein the second divider is configured to receive the RF signal generated by the pickup device, and wherein the second divider generates a second reduced voltage signal;
   a first peak detector to receive the first reduced voltage;
   a second peak detector to receive the second reduced voltage;
   a first output of the first channel configured to output a first output signal to a controller based on an output of the first peak detector and while the received RF signal is in a first voltage range; and
   a second output of the second channel configured to output a second output signal to the controller based on the an output of the second peak detector and while the received RF signal is in a second voltage range, wherein the second voltage range is different than the first voltage range.

2. The voltage sensor of claim 1, wherein:
   the second voltage range overlaps the first voltage range;
   a relationship between the first output signal and peaks of the RF signal is linear over the first voltage range; and
   a relationship between the second output signal and peaks of the RF signal is linear over the second voltage range.

3. A voltage sensor configured for a voltage controlled interface of a plasma processing system, wherein the voltage sensor is configured to receive a radio frequency (RF) signal generated by a pickup device, and wherein the received RF signal is indicative of a RF voltage provided at a substrate in a plasma chamber, the voltage sensor comprising:
   a first divider corresponding to a first channel and having a first capacitance ratio, wherein the first divider is configured to receive the RF signal generated by the pickup device, wherein the first divider generates a first reduced voltage signal;
   a second divider corresponding to a second channel and having a second capacitance ratio, wherein the second divider is configured to receive the RF signal generated by the pickup device, and wherein the second divider generates a second reduced voltage signal;
a first output of the first channel configured to output a first output signal based on the first reduced voltage signal and while the received RF signal is in a first voltage range;
a second output of the second channel configured to output a second output signal based on the second reduced voltage signal and while the received RF signal is in a second voltage range, wherein the second voltage range is different than the first voltage range; and
a switching circuit configured to operate in a first state and a second state, wherein
the first channel is activated while the switching circuit is in the first state,
the first channel is deactivated while the switching circuit is in the second state,
the first output of the first channel is configured to output the first output signal while the switching circuit is in the first state, and
the second output of the second channel is configured to output the second output signal while the switching circuit is in the second state.

4. The voltage sensor of claim 3, wherein:
the first output signal is representative of a voltage of the received RF signal while the switching circuit is in the first state; and
the first output signal is not representative of a voltage of the received RF signal while the switching circuit is in the second state.

5. The voltage sensor of claim 3, wherein:
the switching circuit comprises a first diode connected between the first divider and the first output; and
the first diode is forward biased or activated while the switching circuit is in the first state and reversed biased or deactivated while the switching circuit is in the second state.

6. The voltage sensor of claim 5, wherein:
the switching circuit comprises a second diode having a cathode;
the cathode is connected between the first diode and the first output; and
the second diode is forward biased or activated while the switching circuit is in the second state and reversed biased or deactivated while the switching circuit is in the first state.

7. The voltage sensor of claim 6, wherein:
the first diode is configured to receive a first direct current (DC) voltage while the first channel is activated and does not receive the first DC voltage while the first channel is deactivated; and
the second diode is configured to receive a second DC voltage while the first channel is deactivated and does not receive the second DC voltage while the first channel is activated.

8. The voltage sensor of claim 6, further comprising:
a capacitance connected between (i) the first diode and the second diode and (ii) the first output, wherein the capacitance is configured to alternating current couple the first output;
a first voltage divider comprising a first resistance and a second resistance; and
a second voltage divider comprising the second resistance and a third resistance,
wherein the first voltage divider and the second voltage divider reduce a voltage at a node between (i) the first diode and the second diode and (ii) the first output.

9. The voltage sensor of claim 1, further comprising a first converter and a second converter, wherein:
the first peak detector is configured to receive the first reduced voltage signal via a first diode and generate a first peak signal;
the second peak detector is configured to receive the second reduced voltage signal and generate a second peak signal;
a first converter configured to receive the first peak signal and generate the first output signal; and
a second converter configured to receive the second peak signal and generate the second output signal.

10. The voltage sensor of claim 9, further comprising a capacitance connected between (i) the first diode and a second diode and the (ii) first peak detector, wherein the capacitance is configured to alternating current couple an input of the first peak detector.

11. A voltage controlled interface comprising:
the voltage sensor of claim 3; and
the controller, wherein the controller is configured to transition the switching circuit between the first state and the second state based on the first output signal or the second output signal.

12. A plasma processing system comprising:
the voltage controlled interface of claim 11;
the plasma chamber;
a chuck disposed in the plasma chamber, wherein the pickup device is connected to the chuck;
a power source configured to supply a bias RF power to the chuck; and
the controller is configured to adjust the bias RF power based on first output signal or the second output signal.

13. A method of operating a voltage sensor, wherein the voltage sensor is configured for a voltage controlled interface of a plasma processing system, wherein the voltage sensor is configured to receive a radio frequency (RF) signal generated by a pickup device, and wherein the received RF signal is indicative of a RE voltage provided at a substrate in a plasma chamber, the method comprising:
receiving the RF signal generated by the pickup device at a first divider of a first channel, wherein the first divider has a first capacitance ratio;
generating a first reduced voltage signal via the first divider;
receiving the RF signal generated by the pickup device at a second divider of a second channel, wherein the second divider has a second capacitance ratio;
generating a second reduced voltage signal via the second divider;
providing a first output signal via the first channel based on the first reduced voltage signal and while the received RF signal is in a first voltage range;
providing a second output signal via a the second channel based on the second reduced voltage signal and while the received RF signal is in a second voltage range, wherein the second voltage range is different than the first voltage range;
activating the first channel for the first voltage range;
deactivating the first channel for the second voltage range;
maintaining the second channel in an activated state while the first channel is activated and while the first channel is deactivated; and cross-checking the first output signal of the first channel based on the second output signal of the second channel.

14. The method of claim 13, further comprising:
generating a third reduced voltage via a third divider;
based on the third reduced voltage, generating a third output signal via a third channel; and
cross-checking the second output signal of the second channel based on the third output signal of the third channel.

15. The method of claim 13, wherein:
the first output signal is representative of a voltage of the received RF signal while the first channel is activated; and
the first output signal is not representative of a voltage of the received RF signal while the first channel is deactivated.

16. The method of claim 13, further comprising:
forward biasing a first diode to activate the first channel; and
reversing biasing the first diode to deactivate the first channel.

17. The method of claim 16, further comprising:
forward biasing a second diode while deactivating the first channel to reduce a voltage at an input of a peak detector of the first channel; and
reverse biasing the second diode while activating the first channel.

18. The method of claim 17, further comprising:
supplying a first direct current (DC) voltage to the first diode while the first channel is activated;
refraining from supplying the first DC voltage to the first diode while the first channel is deactivated;
supplying a second DC voltage to the second diode while the first channel is deactivated; and
refraining from supplying the second DC voltage to the second diode while the first channel is activated.

19. The method of claim 18, further comprising:
alternating current couple the first output to prevent a DC voltage from being received at the peak detector of the first channel; and
via a first voltage divider and a second voltage divider, reducing a voltage at a node between (i) the first diode and the second diode and (ii) the first output,
wherein the first voltage divider comprises a first resistance and a second resistance, and
the second voltage divider comprises the second resistance and a third resistance.

20. A voltage controlled interface of a plasma processing system, the voltage controlled interface comprising:
a controller; and
a voltage sensor configured to receive a radio frequency (RE) signal generated by a pickup device, and wherein the received RF signal is indicative of a RF voltage provided at a substrate in a plasma chamber, wherein the voltage sensor comprises
a first divider corresponding to a first channel and having a first capacitance ratio, wherein the first divider is configured to receive the RF signal generated by the pickup device, wherein the first divider generates a first reduced voltage signal,
a second divider corresponding to a second channel and having a second capacitance ratio, wherein the second divider is configured to receive the RF signal generated by the pickup device, and wherein the second divider generates a second reduced voltage signal,
a first output of the first channel configured to output a first output signal to the controller based on the first reduced voltage signal and while the received RF signal is in a first voltage range, and
a second output of the second channel configured to output a second output signal to the controller based on the second reduced voltage signal and while the received RF signal is in a second voltage range, wherein the second voltage range is different than the first voltage range,
wherein the controller is configured to
receive the first output signal and the second output signal, and
based on the first output signal and the second output signal, at least one of (i) control operation of the voltage sensor, or (ii) adjust a RF bias signal to change an amount of direct current bias or a direct current sheath potential at the substrate.

21. A method of operating a voltage sensor, wherein the voltage sensor is configured for a voltage controlled interface of a plasma processing system, wherein the voltage sensor is configured to receive a radio frequency (RF) signal generated by a pickup device, and wherein the received RF signal is indicative of a RF voltage provided at a substrate in a plasma chamber, the method comprising:
receiving the RF signal generated by the pickup device at a first divider of a first channel, wherein the first divider has a first capacitance ratio;
generating a first reduced voltage signal via the first divider;
receiving the RF signal generated by the pickup device at a second divider of a second channel, wherein the second divider has a second capacitance ratio;
generating a second reduced voltage signal via the second divider;
providing a first output signal via the first channel based on the first reduced voltage signal and while the received RF signal is in a first voltage range;
providing a second output signal via a the second channel based on the second reduced voltage signal and while the received RF signal is in a second voltage range, wherein the second voltage range is different than the first voltage range;
forward biasing a diode while deactivating the first channel to reduce a voltage at an input of a peak detector of the first channel; and
reverse biasing the diode while activating the first channel.

* * * * *